July 28, 1964 M. E. EGGMAN 3,142,527

PRINTED CIRCUIT TERMINAL

Filed March 31, 1961

INVENTOR.
MAX E. EGGMAN

BY

Lockwood, Woodard, Smith & Weikart
Attorneys

United States Patent Office 3,142,527

Patented July 28, 1964

3,142,527

PRINTED CIRCUIT TERMINAL

Max E. Eggman, Fort Wayne, Ind., assignor to The Magnavox Company, Fort Wayne, Ind., a corporation of Delaware Filed Mar. 31, 1961, Ser. No. 99,905
3 Claims. (Cl. 339—217)

This invention relates generally to electrical connectors and particularly to a novel electrical terminal adapted especially to use with printed circuit boards.

Many varieties of electrical terminal members are known to those skilled in the art. However, few of these are at all suitable to provide means for connecting external electrical conductors such as wires, to a printed circuit board. One of the difficulties commonly encountered with conventional terminal members is difficulty in holding them properly positioned during soldering. Moreover, solder joints are subject to weakening because of the fact that the solder alone is carrying the mechanical load which may be caused by connecting the external electrical conductor to the terminal member. Consequently, there is not only risk of mechanical failure of the joint, itself, and loss of support for the external conductor, but there is also the risk of loss of electrical continuity in the connection. In addition to this, the solder is usually fused to the thin copper coating of the printed circuit and the holding strength of the terminal is limited to the strength of the bond between the copper joint and the board to which it is mounted. Finally, conventional terminals are, for the most part, excessively expensive, not only in themselves but in the method of mounting to the board.

It is, therefore, a general object of this invention to provide an improved electrical terminal member.

It is a further object of this invention to provide means for attaching a wire or other external electrical conductor to a printed circuit board after the board has been dip soldered.

It is a further object of this invention to provide an electrical terminal member easily mounted in a printed circuit board or the like.

It is a still further object of this invention to provide an electrical terminal member which is easily soldered in place.

It is a still further object of this invention to provide an electrical terminal member for mounting to a printed circuit board insuring durability of mechanical and electrical connection between the terminal and the circuit elements on the board and insuring adequate mechanical mounting strength.

It is a further object of this invention to provide an electrical terminal member economically manufactured in itself and contributing to economical employment in a printed circuit board and terminal assembly.

In a typical embodiment of this invention, a pair of electrically conducting elements of generally elongated form and integral with each other adjacent one end thereof, are folded toward each other so as to have a generally V-shaped form when viewed from the side and in the free (unassembled) state. One of the elements is longer than the other and has shoulders at the side edges thereof approximately equidistant between the distal end and the end joined to the second element. The other element is shaped so as to be resiliently moved toward the one element upon insertion of the joined ends thereof into an aperture provided in the printed circuit board to which the terminal is to be mounted.

The shoulders on the one element are broad enough to overlap the edges of the aperture in the board to limit the extent of passage of the terminal member through the aperture. The other element has a ramp-like upper edge facing generally away from the junction of the elements and which engages the underside of the board prior to the time the shoulders reach abutting relation with the board. However, the ramp is of adequate length to remain engaged with the board at the time the shoulders reach the board so that the resiliency of the elements tending to separate their distal ends securely retains the terminal member to the board whereupon it may be soldered to provide the desired electrical connection and additional rigidity.

The full nature of the invention will be understood from the accompanying drawings and the following description and claims.

Referring to FIGS. 1–5, there is shown a board 11 which may be a printed circuit board. An electrically conducting coating or foil or the like 12 is shown disposed on one face of the board adjacent the aperture 13 extending through the board. The aperture 13 may be conveniently circular in form. Foil may also be used on the other face of the board if desired.

Figure 1:
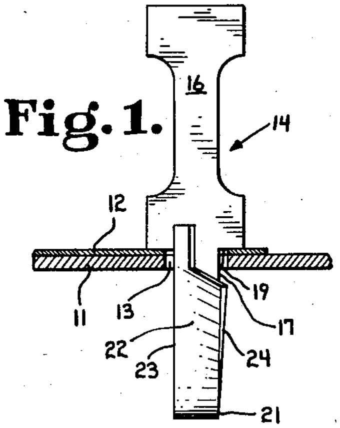
FIG. 1 is a front elevational view of a typical embodiment of the invention in assembly.
Figure 2:
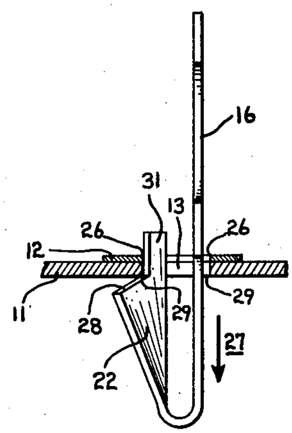
FIG. 2 is a side elevation of the assembly.

The terminal member 14 includes one element or leg 16 having side margins 17 and 18 extending through the aperture 13. A step or shoulder is formed in each of these side margins and has an edge 19 facing generally in the direction of the junction 21 between the first element 16 and the second element or leg 22. The portion of element 16 extending above the board and having a generally I shape in FIG. 1, is provided to facilitate connection of an external electrical conductor such as wire thereto. This portion above the edges 19 may be otherwise formed to provide other types of terminal lugs or connectors for the external electrical conductor as desired, the one shown being merely illustrative of a type around which the wire may be wrapped and soldered.

Figure 3:
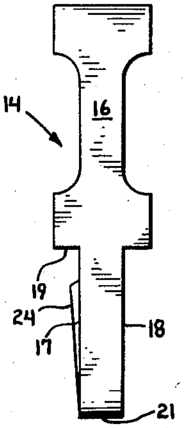
FIG. 3 is a front elevation of the novel terminal itself.
Figure 4:
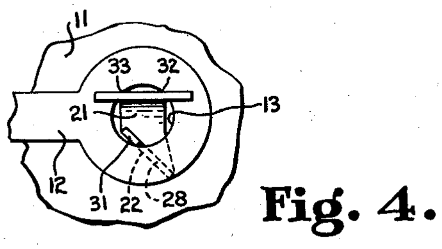
FIG. 4 is a plan view of the assembly of FIGS. 1 and 2.
Figure 5:
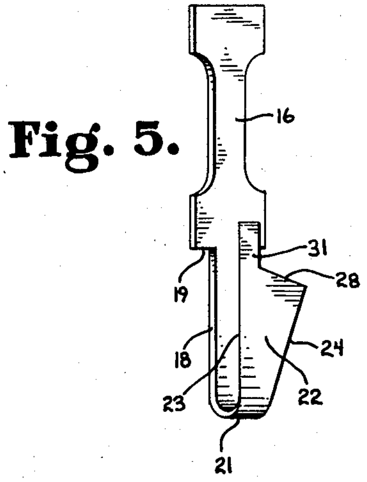
FIG. 5 is an elevation in perspective further illustrating the form of the terminal itself when in the mounted condition of FIGS. 1, 2 and 4.
Figure 6:
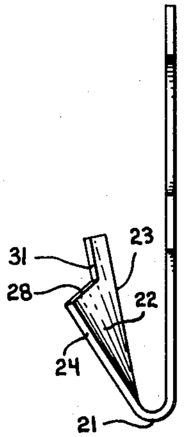
FIG. 6 is a side elevation of the terminal itself illustrating its form in the non-assembled condition for comparison with the form in the assembly view of FIG. 2.

The leg 22, as illustrated in FIG. 6 in the free position, has a side edge 23 which follows a line diverging from the junction 21. It has a second side edge 24 following a line much more radically divergent from the junction 21. As shown in FIGS. 1 and 3, both the side edges 23 and 24 are approximately coplanar with the side margins 18, 17, respectively, of leg 16. Because of the resiliency of the material, which is normally brass, the free or distal end of leg 22 is moved toward leg 16 as edge 24 engages edge 26 of the aperture 13 when the terminal is pushed through the aperture in the direction shown by arrow 27 in FIG. 2.

The advance of the terminal member into the aperture 13 is terminated when the edges 19 of the steps in the element 16 engage the upper face of coating or foil 12 on the board 11. Because of the inclined upper margin 28 of leg 22, which faces away from the junction 21, the margin 28 engages the edge 29 of aperture 13 as soon as edge 24 has passed therethrough. The ramp or incline 28 is long enough and steep enough that it will remain engaged with edge 29 until the edges 19 of element 16 stop the further advance of the element through the board during assembly. It also permits a given terminal to be used with several different thicknesses of board. The resiliency of the material of the terminal member, biasing the distal ends of the two legs thereof in a separating manner, keeps the margin 28 securely engaged with edge 29 so as to firmly lock the terminal member in position in the aperture. The lug 31 extending upwardly from the upper margin 28 provides a means for grasping the terminal from the upper face side of the terminal board to remove it from that side if desired. Also, because of its proximity to the edge 26 of the aperture 13 adjacent the upper face of the board, it also makes possible a solder connection to foil or coating 12 at this point as well as at points 32 and 33 where the side margins 17 and 18, respectively, engage the upper edge of the aperture 13.

It can be seen from the foregoing description that the terminal of this invention may be easily pushed into a printed circuit board and soldered securely in place by any desired method. Moreover, it is well adapted to dip soldering along with the other components (not shown) which may be soldered to the board at the same time. The terminal member will allow lead wires to be secured and soldered to it after dip soldering and/or after the board is assembled into a television chassis or the like. The locking feature of the leg 22 will lock the terminal into place prior to soldering and adds considerable mechanical strength to the completed assembly. Without this locking feature, the holding power of the terminal would be limited to either the strength of the soldered joint or to the strength of the bond between the electrically conducting material such as copper foil, and the board.

Because of the unique and yet simple shape of the terminal member, its piece price and tooling costs are low. Moreover, the mounting detail in the board may be a round hole which is quite inexpensive to tool. Because of the spring loading of the clip, it contacts the edge of the hole in three places, thus greatly reducing the possibility of solder failure.

While the invention has been disclosed and described in some detail in the drawings and foregoing description, they are to be considered as illustrative and not restrictive in character, as modifications may readily suggest themselves to persons skilled in this art and within the broad scope of the invention, reference being had to the appended claims.

The invention claimed is:

1. A terminal for installation in an aperture through a printed circuit board and comprising: a strip of resilient, electrically conducting material folded upon itself so as to form two legs in generally divergent relation in the mechanically unloaded state of said terminal, one of said legs having a shoulder therein for abutting a surface of a printed circuit board and the other of said legs having triangular offset portion with an inclined upper edge for engaging an opposite surface of the board upon projecting said legs into the aperture in the board for engaging the board between said shoulder and inclined edge to securely lock said terminal to said board, and means on said one leg for connecting an electrical energy carrying member to said terminal.

2. A terminal for removable mounting on a terminal board having a terminal receiving aperture therein and comprising: spaced, elongated conductive elements having a junction therebetween and said elements being biased in a distal end separating manner, one of said elements having means therein with an edge generally facing the junction of said elements for engaging one face of a terminal board adjacent the edge of an aperture therein during projection of said elements through said aperture with the junction first, another of said elements having a side edge portion resiliently movable during said projection to a position more proximate said one element, and said another of said elements having a second side edge having a point coplanar with a second side edge of said one element and extending therefrom to a second point, the portion of said edge extending between said points being non-coplanar with said resiliently movable side edge, and said second element having a margin facing generally away from the said junction and beginning at said second point and advancing on an incline generally away from said junction, said inclined margin being disposed toward said junction from a plane vertical to and intersecting said one element at said means for engaging whereby said inclined margin is adapted to engage an edge of said aperture adjacent the face of said board opposite said one face, to securely lock said terminal to said board, and means on one of said elements for connecting an external electrical conductor to said terminal.

3. A terminal for removable mounting on a terminal board having a terminal receiving aperture therein and comprising: spaced, elongated conductive elements joined adjacent one end thereof and biased in a distal end separating manner, one of said elements being principally planar in form and having a step in a side margin thereof with an edge generally facing the joined end of said element for engaging one face of a terminal board adjacent the edge of an aperture therein during projection of said elements through said aperture with the joined ends first, another of said elements having a side edge substantially coplanar with a side edge of said one element and upon said engagement assuming a position in a plane substantially parallel to said edge of said one element, and said another of said elements having a second side edge having a point coplanar with a second side edge of said one element and extending therefrom to a second point, the portion of said edge extending between said points being non-coplanar with said substantially parallel plane, and said second element having a margin facing generally away from the joined end and beginning at said second point and advancing on an incline generally away from said joined end, said inclined margin being disposed between said joined end and a plane vertical to and intersecting said one element at said step whereby said inclined margin is adapted to engage an edge of said aperture adjacent the face of said board opposite said one face to securely lock said terminal to said board, and means on said one element for connecting an external electrical conductor to said terminal.

References Cited in the file of this patent

UNITED STATES PATENTS

| | | |
|---|---|---|
| 2,631,184 | Sampson | Mar. 10, 1953 |
| 2,754,486 | Hathorn | July 10, 1956 |
| 2,948,875 | Batcheller | Aug. 9, 1960 |
| 2,958,063 | Stanwyck | Oct. 25, 1960 |

FOREIGN PATENTS

| | | |
|---|---|---|
| 829,978 | Great Britain | Mar. 9, 1960 |